(12) United States Patent
Chan et al.

(10) Patent No.: US 9,401,200 B1
(45) Date of Patent: Jul. 26, 2016

(54) MEMORY CELLS WITH P-TYPE DIFFUSION READ-ONLY PORT

(71) Applicant: Altera Corporation, San Jose, CA (US)

(72) Inventors: Mark T. Chan, San Jose, CA (US); Shankar Prasad Sinha, San Jose, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 14/579,860

(22) Filed: Dec. 22, 2014

(51) Int. Cl.
| | | |
|---|---|---|
| G11C 11/00 | (2006.01) | |
| G11C 11/419 | (2006.01) | |
| H01L 27/11 | (2006.01) | |
| G11C 11/40 | (2006.01) | |

(52) U.S. Cl.
CPC .......... G11C 11/419 (2013.01); H01L 27/1116 (2013.01); *G11C 11/40* (2013.01)

(58) Field of Classification Search
CPC .... G11C 11/40; G11C 11/409; G11C 11/419; H01L 27/1116
USPC .......................... 365/72, 154, 189.15, 230.05
See application file for complete search history.

(56) References Cited

U.S. PATENT DOCUMENTS

| | | | |
|---|---|---|---|
| 5,285,407 A | 2/1994 | Gale et al. | |
| 5,373,466 A | 12/1994 | Landeta et al. | |
| 5,590,087 A | 12/1996 | Chung et al. | |
| 5,808,932 A | 9/1998 | Irrinki et al. | |
| 5,847,990 A | 12/1998 | Irrinki et al. | |
| 5,894,432 A | 4/1999 | Lofti | |
| 5,982,682 A | 11/1999 | Nevill et al. | |
| 6,091,627 A | 7/2000 | Luo et al. | |
| 6,108,233 A | 8/2000 | Lee et al. | |
| 6,175,533 B1 | 1/2001 | Lee et al. | |
| 6,198,656 B1 | 3/2001 | Zhang | |
| 6,259,643 B1 | 7/2001 | Li | |
| 6,741,517 B1 | 5/2004 | Fisher et al. | |
| 7,106,620 B2 | 9/2006 | Chang et al. | |
| 7,280,423 B1 | 10/2007 | Kuo | |
| 7,400,523 B2 | 7/2008 | Houston | |
| 7,499,312 B2 | 3/2009 | Matick et al. | |
| 7,535,782 B2 * | 5/2009 | Vernet .................... | G11C 7/065 365/154 |
| 7,957,178 B2 | 6/2011 | Houston | |
| 7,983,071 B2 | 7/2011 | Houston | |
| 8,203,867 B2 | 6/2012 | Houston | |
| 8,654,569 B2 | 2/2014 | Houston | |
| 8,681,534 B2 * | 3/2014 | Kohli .................... | G11C 11/412 365/154 |
| 2004/0080999 A1 | 4/2004 | Madurawe | |
| 2006/0002191 A1 | 1/2006 | Frey et al. | |

(Continued)

OTHER PUBLICATIONS

Hsieh et al., U.S. Appl. No. 12/101,114, filed Apr. 10, 2008.

*Primary Examiner* — Tan T. Nguyen

(57) ABSTRACT

A memory cell includes a bistable element and two p-channel transistors (i.e., first and second p-channel transistors). The bistable element includes a plurality of inverting circuits and at least one data storage node. The bistable element may be formed in a first region on the substrate that is partially formed by a p-type diffusion region and an n-type diffusion region. The first and second p-channel transistors are coupled serially. The first p-channel transistor may also have its gate terminal coupled to the at least one data storage node of the bistable element. A method of manufacturing the memory cell includes forming a bistable element having at least first and second data storage nodes, forming a write-only port of the memory cell over an n-type diffusion region and forming a read-only port of the memory cell over a p-type diffusion region.

17 Claims, 6 Drawing Sheets

(56) References Cited

U.S. PATENT DOCUMENTS

| | | |
|---|---|---|
| 2006/0250842 A1 | 11/2006 | Adams et al. |
| 2007/0035986 A1 | 2/2007 | Houston |
| 2010/0020590 A1* | 1/2010 | Hsueh .................. G11C 11/419 365/154 |
| 2011/0292743 A1* | 12/2011 | Zimmerman ........ G11C 11/412 365/189.15 |
| 2013/0003443 A1 | 1/2013 | Houston |
| 2013/0229859 A1 | 9/2013 | Houston |
| 2015/0279452 A1* | 10/2015 | Yoon .................... G11C 11/419 365/154 |

* cited by examiner

US 9,401,200 B1

MEMORY CELLS WITH P-TYPE DIFFUSION READ-ONLY PORT

BACKGROUND

There are multiple types of memory devices. Amongst them include static random access memory (SRAM) devices. Generally, SRAMs are implemented within microprocessor devices, microcontroller devices or other processing devices, for example as internal caches. SRAMs may differ from dynamic random access memory (DRAM) devices in at least one particular feature, which is periodic refresh, as in the SRAMs do not require periodic refresh of data bits stored in their memory cells.

There are different types of SRAM memory cell designs. The most commonly available SRAM memory cell design includes six transistors (i.e., a 6T SRAM cell), of which two n-channel metal oxide semiconductor (NMOS) transistors and two p-channel metal oxide semiconductor (PMOS) transistors form a cross-coupled inverter with two additional NMOS transistors forming pass gates to the respective terminals of the cross-coupled inverters. The 6T SRAM cell generally occupies a small area on the semiconductor substrate. Therefore, the 6T SRAM cell is generally preferred when area on a semiconductor substrate may be limited. However, 6T SRAM cells may have poor noise margin, which may adversely affect the performance of SRAM devices.

As an alternative, eight-transistor SRAM structures (commonly referred to as 8T SRAM cells) may be used in place of 6T SRAM cells. Compared to 6T SRAM cells, 8T SRAM cells have better noise margin. However, the 8T SRAM structure requires a relatively large silicon substrate area. In addition to that, the 8T SRAM cell, which is predominantly formed using NMOS transistors, may not satisfy the p-type diffusion requirement on the silicon substrate.

SUMMARY

Embodiments described herein include a p-type diffusion read-only port for memory cells and a method of manufacturing such memory cells. It should be appreciated that the embodiments can be implemented in numerous ways, such as a process, an apparatus, a system, a device, or a method. Several embodiments are described below.

In one embodiment, a memory cell includes a bistable element and two p-channel transistors (i.e., first and second p-channel transistors). The bistable element includes a plurality of inverting circuits and at least one data storage node. The bistable element may be formed in a first region on the substrate that is partially formed by a p-type diffusion region and an n-type diffusion region. The first and second p-channel transistors are coupled in series. The first p-channel transistor may also have its gate terminal coupled to the at least one data storage node of the bistable element.

In another embodiment, a method of manufacturing a memory cell includes a step of forming a bistable element having at least first and second data storage nodes. The method also includes steps of forming a write-only port of the memory cell over an n-type diffusion region and to form a read-only port of the memory cell over a p-type diffusion region.

Further features of the invention, its nature and various advantages will be more apparent from the accompanying drawings and the following detailed description of the preferred embodiments.

DETAILED DESCRIPTION

The following embodiments describe a p-type diffusion read-only port for a memory cell and a method of manufacturing such a memory cell. It will be obvious, to one skilled in the art, that the present exemplary embodiments may be practiced without some or all of these specific details. In other instances, well-known operations have not been described in detail in order not to unnecessarily obscure the present embodiments.

Figure 1:
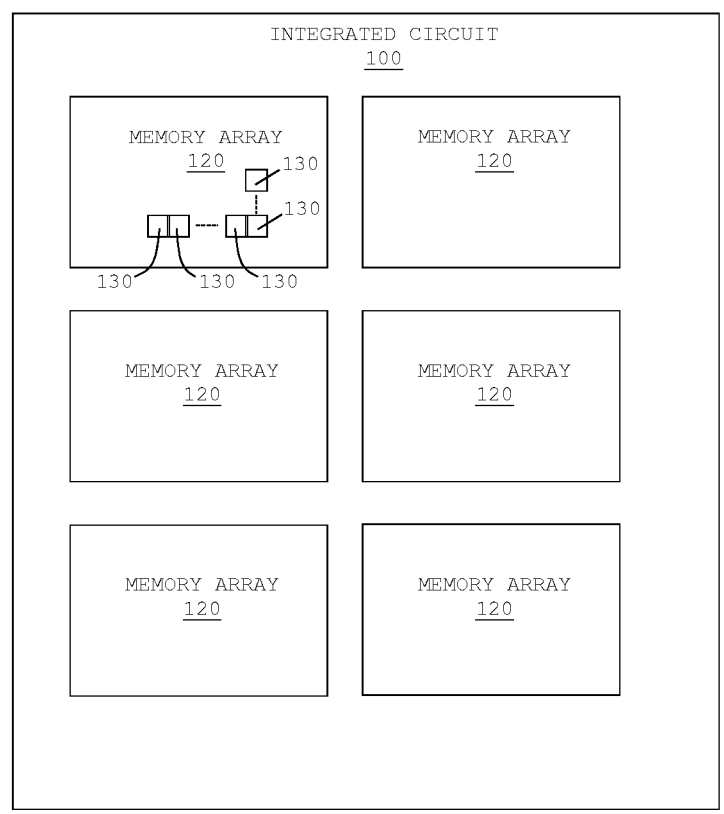
FIG. 1 shows an illustrative integrated circuit device in accordance with one embodiment of the present invention.

FIG. 1, meant to be illustrative and not limiting, shows an integrated circuit device in accordance with one embodiment of the present invention. Integrated circuit device 100 includes multiple memory arrays 120. Each memory array 120 may include multiple memory cells 130.

Integrated circuit device 100 may be an application specific integrated circuit (ASIC) device, an application standard specific product (ASSP) device or a programmable logic device (PLD). Generally, ASIC and ASSP devices may perform fixed and dedicated functions whereas PLD devices may be programmable to perform a variety of functions. An example of a PLD device may be a field programmable gate array (FPGA) device. In an alternative embodiment, integrated circuit device 100 may be a static random access memory (SRAM) device.

Integrated circuit device 100 may form a part of a communication system, a processing system, etc. Integrated circuit device 100 may be utilized for storing data for other devices, such as, microprocessor devices or controller devices.

In one embodiment, integrated circuit device 100 may be formed on a semiconductor substrate. The semiconductor substrate may be a single crystal silicon wafer, a silicon-on-insulator (SOI) wafer, a hybrid orientation technology (HOT) wafer with regions of different crystal orientations, or other semiconductor material appropriate for fabrication of integrated circuit device 100. It should be appreciated that multiple integrated circuits devices 100 may be formed on a single piece of semiconductor substrate. Hence, smaller integrated circuit devices may yield more integrated circuits devices 100 per semiconductor substrate (i.e., die per wafer (DPW)).

Referring still to FIG. 1, there may be six memory arrays 120 arranged in a two by three (i.e., 2×3) configuration on integrated circuit device 100. It should be noted that the term 'array' for memory arrays 120 may refer to the manner in which memory cells 130 are arranged within the respective memory arrays 120.

In one embodiment, memory arrays 120 may also include signal lines (not shown in FIG. 1). The signal lines may be utilized for accessing memory cells 130. For example, memory arrays 120 may include, among others, write word line (WWL), read word line (RWL), write bit line (WBL) and write bit line bar (WBL/). Specific details of these signal lines are described with reference to FIG. 2.

In addition to that, each memory array 120 may be coupled to other circuits, for example, address decoding circuits, data port circuits, sense-amplifier (sense-amp) circuitry and redundancy circuitry. In one embodiment, the address decoding circuit may receive the address of a particular memory element 130 and may assert the corresponding write word line or read word line that of that particular memory cell 130. The data port circuits may receive data bit signals from external circuitry and transmit the data bit signals to the relevant memory cells 130. The sense-amp circuitry may be utilized to sense low power signals from the read bit line, which represents a data bit (i.e., data bit '1' or '0') stored in a memory cell 130 within a memory array 120, and amplify the relatively small voltage to a recognizable logic level so that the data bit can be interpreted properly by circuits that are outside of that memory array 120. The redundancy circuitry may be attached to a particular memory array 120 and may be utilized to replace defective memory elements 130 within that memory array 120.

Referring still to FIG. 1, memory cells 130 may include eight-transistor (8T) memory cells. It should be appreciated that the 8T memory cells 130 may have better noise margin compared to a six-transistor (6T) memory cell. There are two types 8T configuration memory cell 130, for example, two write-read (2WR) type and one-write and one read (1W1R) type. The 2WR type 8T memory cell may have two ports, of which both may be utilized for read and write operations. The 1W1R 8T memory cell also includes two ports. However, in the 1W1R 8T memory cell, one of the ports is utilized only for read operations whereas the remaining port is utilized only for write operations.

In one embodiment, integrated circuit device 100 may have a storage size of 4 kilobits (i.e., 4×2^10 bits) or 64 kilobits (i.e., 64×2^10 bits). Each bit may be stored into one memory cell. Therefore, there may be 4096 memory cells 130 (i.e., 4×2^10) for integrated circuit device 100 with a storage size of 4 kilobits.

Alternatively, there may be 65536 memory cells 130 (i.e., 64×2^10) for integrated circuit device 100 with a storage size of 64 kilobits. It should be appreciated that the number of memory cells 130 in an integrated circuit device 100 may depend on the type of applications integrated circuit device 100 may be utilized for. Accordingly, fewer or more memory cells may be included in integrated circuit device 100 in this context.

Figure 2:
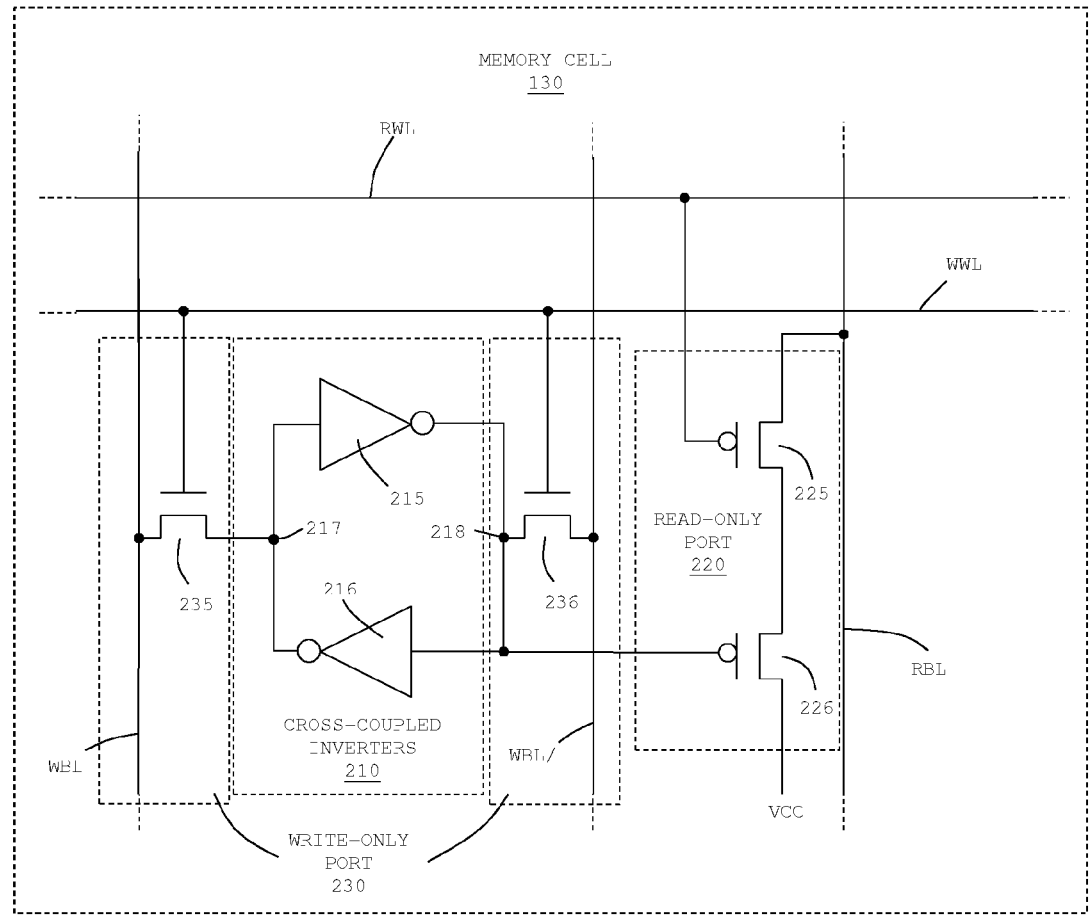
FIG. 2 shows an illustrative memory cell in accordance with one embodiment of the present invention.

FIG. 2, meant to be illustrative not limiting, illustrates a memory cell in accordance with one embodiment of the present invention. Memory cell 130 includes cross-coupled inverters 210, two n-channel metal oxide semiconductor (NMOS) transistors 235 and 236, and p-channel metal oxide semiconductor (PMOS) transistors 225 and 226. In one embodiment, memory cell 130 may represent a detailed view of memory cell 130 shown in FIG. 1.

Memory cell 130 may also be referred to as an 8T memory cell because there are eight transistors (i.e., two transistors (not shown) that form each of the inverters 215 and 216, two NMOS transistors 235 and 236 and PMOS transistors 225 and 226) that form one memory cell 130. As described above with reference to FIG. 1, memory cell 130 may be configured as a 1W1R dual-port memory cell. In such a configuration, one of the ports may be a write-only port while the port may be a read-only port. Write-only ports 230 may include NMOS transistors 235 and 236 and read-only port 220 may include PMOS transistors 225 and 226. It should be appreciated that write-only ports 230 may be referred to as a write port or a write circuit. Similarly, read-only port 220 may be referred to as a read port or a read circuit.

Memory cell 130 may include multiple signal lines in order to read and write a particular data bit into memory cell 130. In one embodiment, memory cell 130 includes a write word line (WWL), a read word line (RWL), a write bit line (WBL), a write bit line bar (WBL/) and a read bit line (RBL). The dotted ends for each WWL, RWL, WBL, WBL/ and RBL indicate that memory cell 130 may form a memory array where multiple similar memory cells 130 may be coupled together (i.e., similar to memory cells 130 within memory arrays 120 of FIG. 1).

Cross-coupled inverters 210 include two inverters 215 and 216. Cross-coupled inverters 210 may be utilized for storing a data bit '1' or '0.' Hence, in one embodiment, cross-coupled inverters 210 may also be referred to as a bistable element or a cross-coupled latch. It should be appreciated that each inverter 215 or 216 may be formed using one PMOS transistor and one NMOS transistor (the detailed implementation of inverters 215 and 216 is not shown in order to not unnecessarily obscure the present invention). The PMOS and NMOS transistors are coupled in series (i.e., a source-drain terminal of the PMOS transistor is coupled to a corresponding source-drain terminal of the NMOS transistor). The remaining source-drain terminals of the respective PMOS transistors for inverters 215 and 216 may be coupled to a power supply voltage terminal (i.e., VCC terminal) and the source-drain terminals of the respective NMOS transistors for inverters 215 and 216 may be coupled to a ground level voltage terminal. It should be appreciated that source and drain terminals of a transistor may sometimes be used interchangeably and can be referred to as source-drain terminals.

As shown in the embodiment of FIG. 2, the output terminal of inverter 216 and the input terminal of inverter 215 are coupled to terminal 217, which is further coupled to a source-drain terminal of NMOS transistor 235. The output terminal of inverter 215 and the input terminal of inverter 216 are coupled to terminal 218, which is further coupled to a source-drain terminal of NMOS transistor 236. Due to the configuration of cross-coupled inverters 210, the value of a data bit at terminal 217 may always be the complement of the value of the data bit at terminal 218. For example, when there is the value of the data bit at terminal 217 is a logic high value (e.g., logic 1), the value of the data bit at terminal 218 may be a logic low value (e.g., logic 0). Conversely, when terminal 217 is at a logic low level, terminal 218 may be at a logic high level.

Referring still to FIG. 2, NMOS transistors 235 and 236 form write-only port 230 for memory cell 130. Write-only port 230 allows data bits to be written to and stored in memory cell 130. In one embodiment, NMOS transistors 235 and 236 for memory cell 130 may also be referred to as pass-gate transistors. A data bit may need to pass through one of these pass-gate transistors in order for it to be stored in cross-coupled inverters 210. As shown in the embodiment of FIG. 2, source-drain and gate terminals of NMOS transistor 235 may be coupled to the respective write lines, WBL and WWL. Source-drain and gate terminals of NMOS transistor 236 may be coupled to the respective write lines WBL/ and WWL.

In order to write a data bit '1' into memory cell 130, the respective bit lines WBL and WBL/ may transmit the data bit '1' and its complement data bit '0' from external circuitry that may be coupled to memory cell 130. In one embodiment, the external circuitry may be a data port circuit coupled to memory array 120 of FIG. 1. During the write operation, the word line WWL may be placed at a logic high voltage level by an external circuit coupled to the memory array (i.e., memory array 120 of FIG. 1), which places gate terminals of NMOS transistors 235 and 236 at a voltage high level (i.e., a voltage level that may be enough to activate the NMOS transistors, for example, 1 volt (V)). The data bit '1' may be transmitted to terminal 217 through NMOS transistor 235 and the data bit '0' may be transmitted to terminal 218 through NMOS transistor 236. Hence, terminal 217 is held at a logic high level and terminal 218 is held at a logic low level when memory cell 130 is storing a logic high value.

Alternatively, in order to write a data bit '0' into memory cell 130, the respective bit lines WBL and WBL/may transmit a data bit'0' and a data bit '1' respectively from the external circuitry. Similar to writing a data bit '1,' the word line WWL may also be placed at a high voltage, which places gate terminals of NMOS transistors 235 and 236 at a high voltage level (hence, NMOS transistors 235 and 236 are activated). The data bit '0' may be transmitted to terminal 217 through NMOS transistor 235 and the data bit '1' may be transmitted to terminal 218 through NMOS transistor 236. Hence, terminal 217 is held at a logic low level and terminal 218 is held at a logic high level when memory cell 130 is storing a logic low value.

PMOS transistors 225 and 226 form read-only port 220 for memory cell 130. Read-only port 220 may be enabled when accessing a data bit stored in memory cell 130. As shown in FIG. 2, PMOS transistors 225 and 226 are coupled in series (i.e., a source-drain terminal of PMOS transistor 226 may be coupled to a source-drain terminal of PMOS transistor 225). The other source-drain terminal and the gate terminal of PMOS transistor 226 may be coupled to a power supply terminal (i.e., VCC terminal) and terminal 218, respectively. The other source-drain terminal and gate terminal of PMOS transistor 225 may be coupled to the RBL bit line and the RWL word line, respectively. (The read operation through read-only port 220 will be described in detail below with reference to FIG. 3.)

In one embodiment, PMOS transistors 225 and 226 may be transistors having a threshold voltage of 0 volt (V). In an alternative embodiment, PMOS transistors 225 and 226 may be low-threshold voltage (Low-VT) transistors. As an example, the low-threshold voltage PMOS transistors 225 and 226 may have a threshold voltage level of −0.4 V. It should be appreciated that the low-threshold voltage PMOS transistors 225 and 226 may prevent current leakage when memory cell 130 is in an idle state (i.e., when the memory cell is not in either read or write mode).

PMOS transistors 225 and 226 implemented as read-only port 220 may increase the p-type diffusion region in memory cell 130. Therefore, read-only port 220 formed using PMOS transistors 225 and 226 may satisfy a particular semiconductor fabrication process requirement (typically provided by a manufacturing plant) on the minimum requirement of the p-type diffusion region within a memory cell. It should be appreciated that, unlike the embodiment of FIG. 2, a read-only port formed with NMOS transistors may require p-type diffusion dummy structures in order to meet the minimum p-type diffusion requirement.

In one embodiment, the minimum requirement for the p-type diffusion region in a memory cell such as memory cell 130 may be 4% of the total area of the memory cell. Similarly, memory cell 130 as shown in the embodiment of FIG. 2 may also need to satisfy the minimum requirement of n-type diffusion region as part of a particular semiconductor fabrication process requirement. In one embodiment, the minimum requirement for the n-type diffusion region in the memory cell may be 4% of the total area the memory cell.

In one embodiment, a p-type diffusion region or an n-type diffusion region may be formed in a semiconductor substrate (e.g., a silicon substrate, a germanium substrate, etc.) after a doping process. During the doping process, impure atoms are introduced to the semiconductor substrate. The impure atoms may be either donor atoms or acceptor atoms. When donor atoms are introduced, the donor atoms may donate their additional electrons to atoms of the semiconductor substrate. This may form an n-type diffusion region. As an example, the donor atoms may include Phosphorous and Arsenic atoms. When acceptor atoms are introduced, the acceptor atoms may accept electrons from the valence band of the semiconductor substrate, which will form a p-type diffusion region in the semiconductor substrate. As an example, the acceptor atoms may be Boron and Aluminum atoms.

Figure 3:
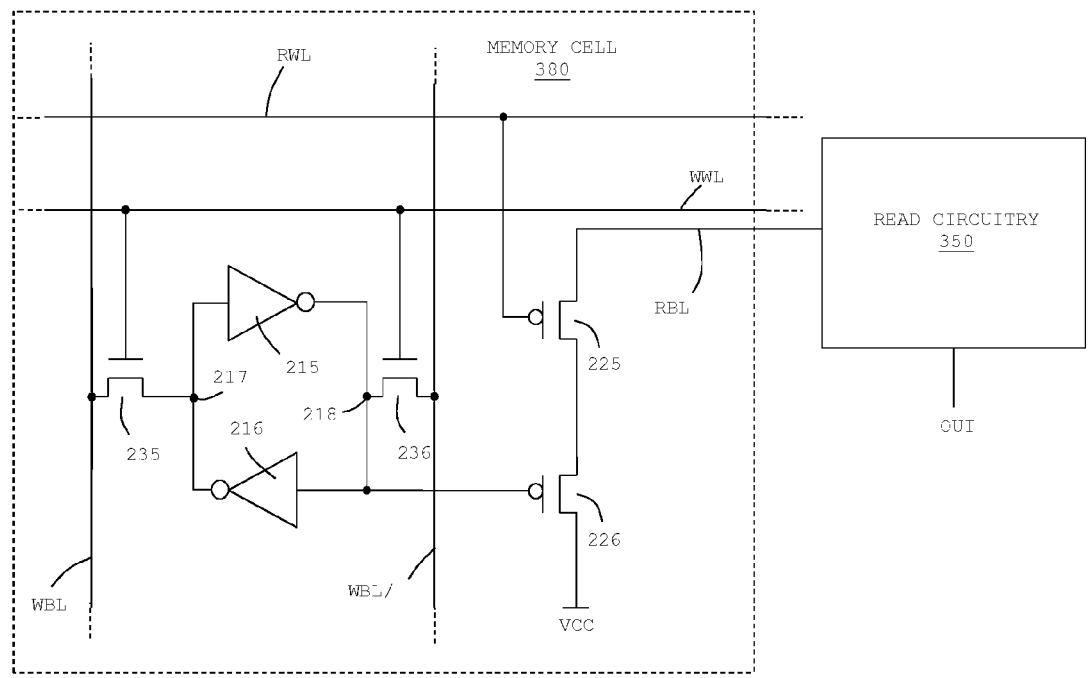
FIG. 3 shows illustrative read circuitry that is coupled to a read-only port of a memory cell in accordance with one embodiment of the present invention.

FIG. 3, meant to be illustrative and not limiting shows read circuitry that is coupled to a read-only port of a memory cell in accordance with one embodiment of the present invention. Read circuitry 350 may be utilized for reading a data bit that is stored within memory cell 380. Read circuitry 350 may be formed using multiple transistors (e.g., NMOS transistors and PMOS transistors), inverters, and NAND circuits (e.g., latches). Terminal OUT of read circuitry 350 may transmit the data bit out of a memory array (e.g., memory array 120 of FIG. 1).

Referring still to FIG. 3, memory cell 380 may be similar to memory cell 130 of FIG. 2. Hence, for the sake of brevity, elements that have been described above (e.g., inverters 215 and 216, NMOS transistors 235 and 236 and PMOS transistors 225 and 226) may not be described in detail again. As shown in FIG. 3, the RBL bit line is coupled to an input terminal of read circuitry 350. Read circuitry 350 may either generate: (i) a default low voltage level (i.e., a logic value 0) at its terminal OUT or (ii) a high voltage level (i.e., a logic value 1) at its terminal OUT when a logic value 1 is stored in memory cell 380.

When memory cell 380 is in a read mode, the RWL word line may receive a logic value 0. Alternatively, when memory cell 380 is in an idle state or in a write mode, the RWL word line may receive logic value 1.

When a data bit '1' is to be read out from memory cell 380, a data bit '0' at terminal 218 (which is the complement of data bit '1' at terminal 217) may be transmitted to the gate terminal of PMOS transistor 226. PMOS transistors 225 and 226 may be activated because voltages applied to the gates are at a low voltage level (or a logic low value, 0). Hence, the RBL bit line may be at a logic value 1 (as a result of the VCC terminal coupled to the source-drain terminal of PMOS transistor 226) and a logic value 1 may be transmitted out of the OUT terminal of read circuitry 350. In this scenario, the output (logic 1) from memory cell 380 may overwrite the default value 0 that is generated by read circuitry 350. As such, read circuitry 350 may output the logic 1 value at terminal OUT when data bit 1 is stored in memory cell 380.

However, when a data bit '0' stored in memory cell 380 is to be read out from memory cell 380, a data bit '1' at terminal 218 (which is the complement of data bit '0' at terminal 217) may be transmitted to the gate terminal of PMOS transistor 226. As a result, PMOS transistor 226 is deactivated even though PMOS transistor 225 may be activated because the gate of PMOS transistor 225 receives low voltage level from RWL word line. Therefore, in this scenario, the read circuitry 350 may output its default value (e.g., logic value 0) at terminal OUT. It should be noted that read circuitry 350 may include common circuit elements (e.g., a latch that may be reset by default to generate a logic value 0 when memory cell 380 stores a data bit 0 and may be set by the memory cell 380 when a data bit 1 is read out from memory cell 380, pre-charge circuitry and keeper transistors) that are not shown and described herein in order to not unnecessarily obscure the present invention.

Figure 4:
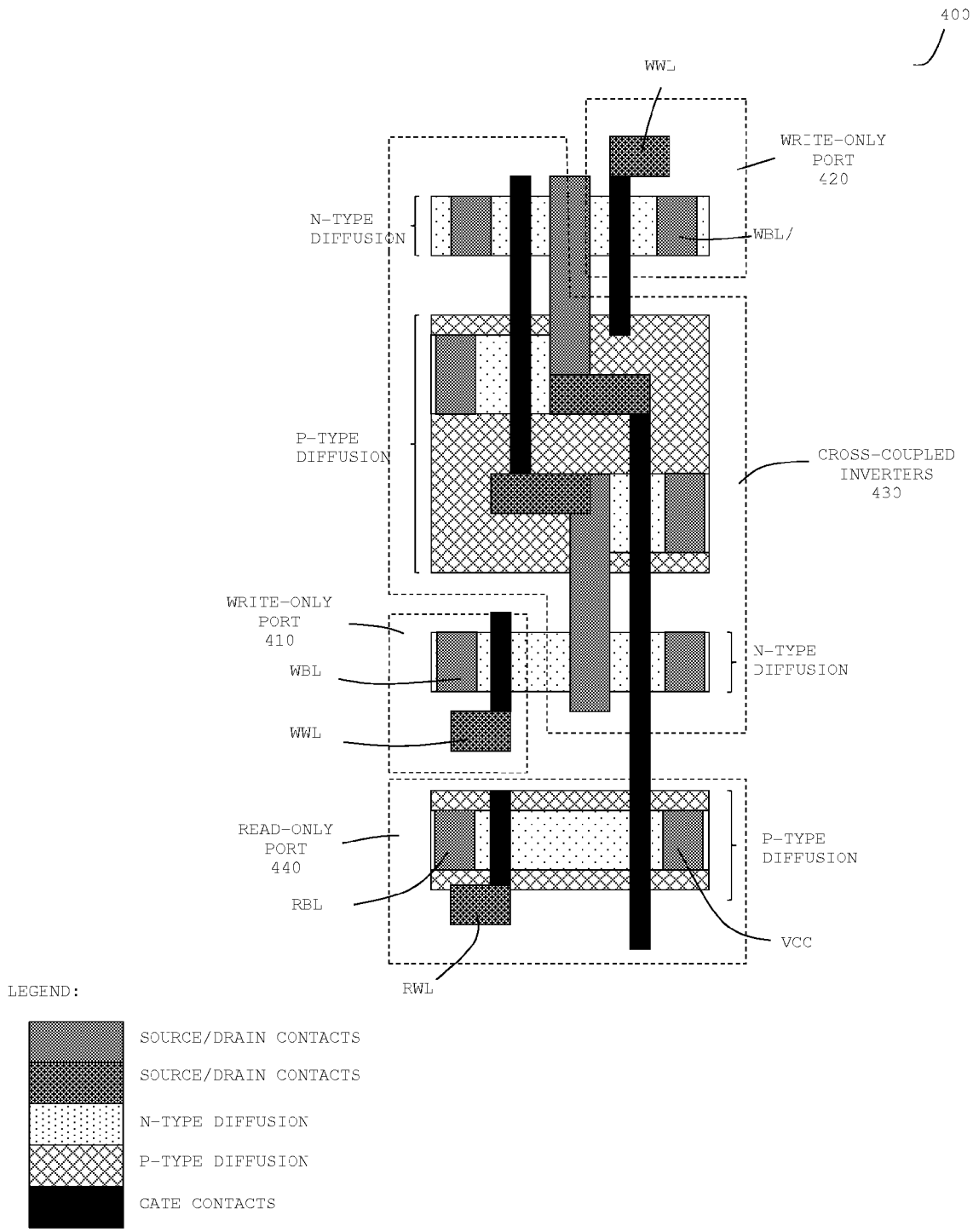
FIG. 4 shows an illustrative layout for a memory cell in accordance with one embodiment of the present invention.

FIG. 4, meant to be illustrative and not limiting, illustrates a layout for a memory cell in accordance with one embodiment of the present invention. Layout 400 may be a design layout for memory cell 130 of FIG. 2 or memory cell 380 of FIG. 3. In one embodiment, layout 400 may be utilized to form multiple photolithography masks for semiconductor fabrication processes. A person skilled in the art appreciates how each of the designs on layout 400 may be translated into a photolithography mask.

Layout 400 includes two write-only port regions 410 and 420, one cross-coupled inverters region 430 and one read-only port region 440. In one embodiment, layout 400 may be utilized to manufacture a memory cell with a width of 0.56 micrometer (μm) and a length of 1.3 micrometer (μm) on a semiconductor substrate. Therefore, the area size may be approximately 1.1 $\mu m^2$ to 1.3 $\mu m^2$.

Each write-only port region 410 or 420 may include one NMOS transistor (i.e., a pass-gate transistor). Write-only port regions 410 and 420 may be a layout design for the respective NMOS transistor 235 and 236 shown in FIGS. 2 and 3. In one embodiment, each of the NMOS transistors may have a gate terminal that is coupled to the write word line (i.e., WWL). However, a source-drain terminal of the NMOS transistor in write-only port region 410 may be coupled to the write bit line (i.e., WBL). In addition to that, a source-drain terminal of the NMOS transistor in write-only port region 420 may be coupled to the write bit line bar (i.e., WBL/).

Each of the n-type diffusion regions that include NMOS transistors for the respective write-only port regions 410 and 420 may also include an additional NMOS transistor, which forms a part of a cross-coupled inverter circuit. The additional NMOS transistor is located adjacent to either write-only port region 410 or 420. In one embodiment, cross-coupled inverters region 430 illustrates a layout of cross-coupled inverters 210 of FIG. 2. The PMOS transistors of cross-coupled inverters region 430 are formed on p-type diffusion region.

Still referring to FIG. 4, read-only port region 440 may also be formed on a p-type diffusion region. In one embodiment, read-only port region 440 may be similar to read-only port 220 of FIG. 2. Read-only port region 440 may include two PMOS transistors, which may be similar to PMOS transistors 225 and 226 of FIG. 2.

In one embodiment, the ratio of a total area encompassing the p-type diffusion regions relative to the total area of the memory cell may be between 0.04 and 0.22 (which may be within a predefined ratio for a p-type diffusion region as needed by a particular design rule provided by a fabrication plant). The embodiment of FIG. 4 does not require any additional dummy p-diffusion regions in order to satisfy the design rule provided by the fabrication plant. In addition to that, the ratio of a total area encompassing the n-type diffusion region relative to the total area of the memory cell may also be between 0.04 and 0.22 (which may be within the predefined ratio of an n-type diffusion region).

Figure 5:
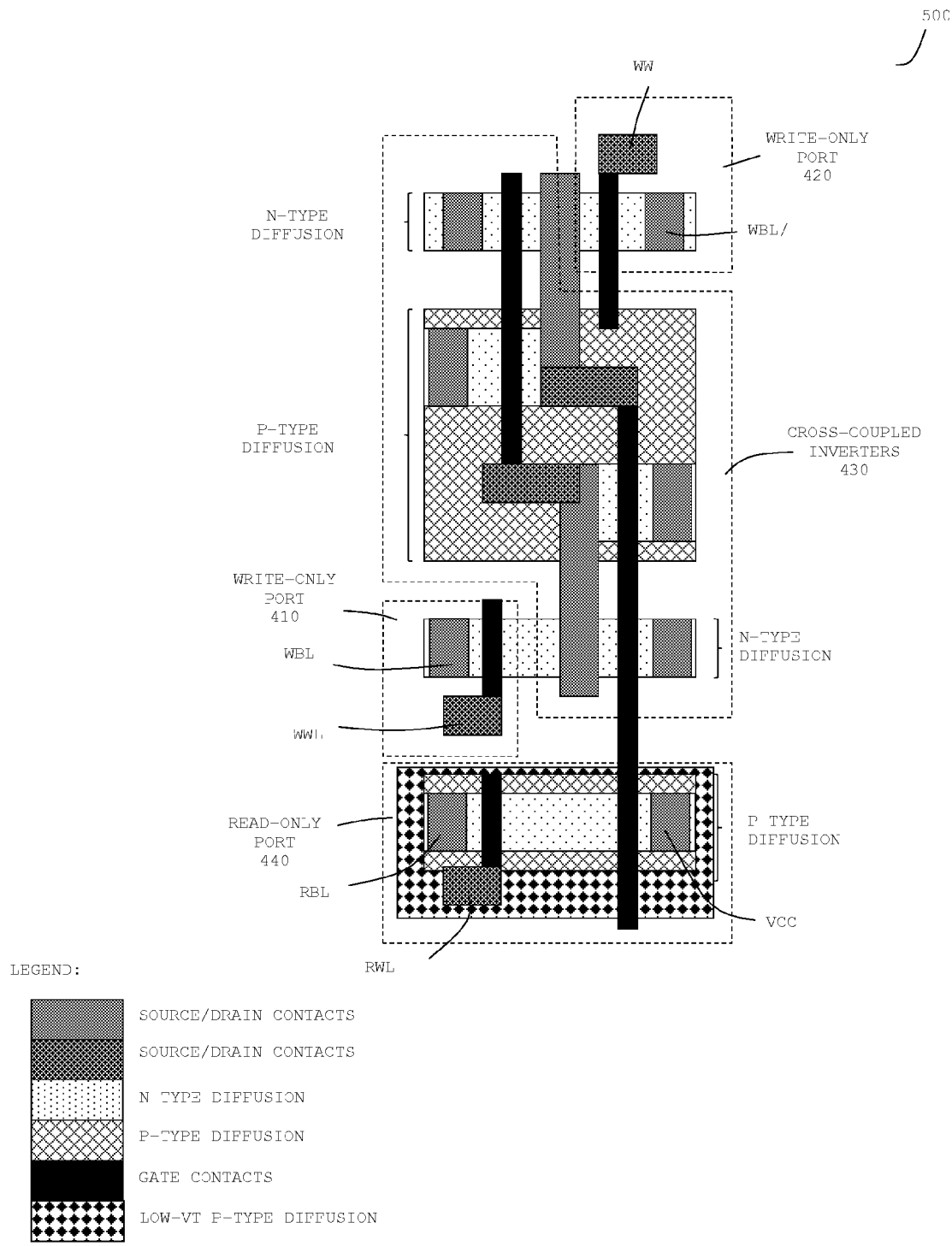
FIG. 5 shows another illustrative layout of a memory cell in accordance with one embodiment of the present invention.

FIG. 5, meant to be illustrative and not limiting, illustrates another layout of a memory cell in accordance with one embodiment of the present invention. Layout 500 may be similar to layout 400 of FIG. 4. However, the p-type diffusion region in layout 500 may be surrounded by a low threshold voltage p-type diffusion region. In one exemplary embodiment, the low threshold voltage p-type diffusion region may have a threshold voltage level of −0.4 V. The remaining elements (i.e., write-only ports 410 and 420, cross-coupled inverters 430 and read-only port 440) may be similar to those shown in layout 400 and described above with reference to FIG. 4. As such, for the sake of brevity, these elements are not repeated. The low-threshold voltage p-type diffusion region may allow an under drive electrical current across the PMOS transistors within read-only port region 440. Apart from allowing under drive capability, the PMOS transistors formed in the low-threshold p-type diffusion region may have a low leakage, especially when PMOS transistors in read-only port region 440 are turned off. A person skilled in the art may appreciate the manner in which low-threshold voltage p-type diffusion region may affect current drive and the low leakage of a PMOS transistor.

Figure 6:
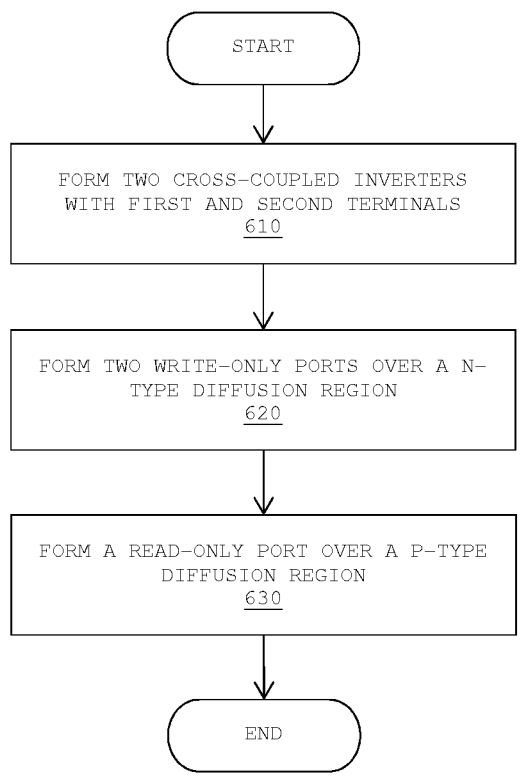
FIG. 6 shows a flowchart on an illustrative method to form a memory element in accordance with one embodiment of the present invention.

FIG. 6, meant to be illustrative and not limiting, illustrates a method to form a memory element or memory cell in accordance with one embodiment of the present invention. The memory element may be similar to memory cell 130 of FIG. 2. At step 610, two cross-coupled inverters are formed. The two cross-coupled inverters may have two terminals. In one embodiment, the two cross-coupled inverters may be cross-coupled inverters 210 of FIG. 2 and the two terminals may be terminal 217 and 218 of FIG. 2. In terms of the layout, the two cross-coupled inverters may be similar to cross-coupled inverters region 430 of FIG. 4 or 5, in one embodiment.

At step 620, two write-only ports are formed over an n-type diffusion region. In one embodiment, one of the write-only ports may include NMOS transistor 235 of FIG. 2 and another of the write-only ports may include NMOS transistor 236 of FIG. 2. The n-type diffusion region may be shown by the respective write-only port regions 410 and 420 of FIG. 4 or 5. The manner in which the two write-only ports are coupled to the cross-coupled inverters may be similar to the one shown in memory cell 130 of FIG. 2.

At step 630, a read-only port for the memory cell may be formed over a p-type diffusion region. In one embodiment, the read-only port may include PMOS transistors 225 and 226 of FIG. 2. In terms of layout, the read-only port may be similar to read-only port region 440 of FIG. 4 formed on a p-type diffusion region. Alternatively, the read-only port may be similar to read-only port region 440 of FIG. 5, which is formed on a low-threshold voltage p-type diffusion region. In one embodiment, a memory cell as shown by layout 400 of FIG. 4 or layout 500 of FIG. 5 may be formed at the completion of step 630.

The embodiments thus far have been described with respect to integrated circuits. The methods and apparatuses described herein may be incorporated into any suitable circuit. For example, they may be incorporated into numerous types of devices such as programmable logic devices, application specific standard products (ASSPs), and application specific integrated circuits (ASICs). Examples of programmable logic devices include programmable arrays logic (PALs), programmable logic arrays (PLAs), field programmable logic arrays (FPGAs), electrically programmable logic devices (EPLDs), electrically erasable programmable logic devices (EEPLDs), logic cell arrays (LCAs), complex programmable logic devices (CPLDs), and field programmable gate arrays (FPGAs), just to name a few.

The programmable logic device described in one or more embodiments herein may be part of a data processing system that includes one or more of the following components: a processor; memory; IO circuitry; and peripheral devices. The data processing can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be one of the family of devices owned by ALTERA Corporation.

Although the methods of operations were described in a specific order, it should be understood that other operations may be performed in between described operations, described operations may be adjusted so that they occur at slightly different times or described operations may be distributed in a system which allows occurrence of the processing operations at various intervals associated with the processing, as long as the processing of the overlay operations are performed in a desired way.

Although the foregoing invention has been described in some detail for the purposes of clarity, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A memory cell, comprising:
    a bistable element that includes a plurality of inverting circuits and that includes at least one data storage node, wherein the plurality of inverting circuits includes pull-up transistors; and
    first and second p-channel transistors that are coupled in series, wherein the first p-channel transistor has a gate terminal that is coupled to the at least one data storage node of the bistable element, wherein the first and second p-channel transistors have a first threshold voltage, and wherein the pull-up transistors of the bistable element have a second threshold voltage that is different than the first threshold voltage.

2. The memory cell as defined in claim 1, further comprising:
    a power supply line, wherein the first p-channel transistor has a source terminal that is coupled to the power supply line.

3. The memory cell as defined in claim 1, further comprising:
    a read word line; and
    a read data line, wherein the second p-channel transistor has a gate terminal that is coupled to the read word line and a drain terminal that is coupled to a read bit line.

4. The memory cell as defined in claim 1, further comprising:
    first and second n-channel transistors, wherein the first n-channel transistor is coupled to the at least one data storage node, and wherein the second n-channel transistor is coupled to another data storage node of the bistable element.

5. The memory cell as defined in claim 4, further comprising:
    a write word line that is coupled to gate terminals of the first and second n-channel transistors;
    a write bit line that is coupled to a source-drain terminal of the first n-channel transistor; and
    a write bit line bar that is coupled to a source-drain terminal of the second n-channel transistor.

6. The memory cell as defined in claim 1, wherein the first threshold voltage of the first and second p-channel transistors is in a range of zero volts (V) to −0.4 V.

7. The memory cell as defined in claim 1, wherein the memory cell is a part of an array of memory cells, of which a region defining the array of memory cells does not include dummy structures.

8. The memory cell as defined in claim 1, wherein the memory cell forms part of a configuration memory of a programmable integrated circuit.

9. A memory cell formed on a semiconductor substrate, comprising:
    a bistable element formed in a first region on the substrate comprising partially of a p-type diffusion region and an n-type diffusion region;
    a read circuit that is coupled to the bistable element and that is formed in a second region on the substrate, wherein the second region comprises an additional p-type diffusion region; and
    a write circuit that is coupled to the bistable element and that is formed within the n-type diffusion region, wherein the n-type diffusion region is physically interposed between the p-type diffusion region in the first region and the additional p-type diffusion region in the second region.

10. The memory cell as defined in claim 9, wherein the write circuit comprises an n-channel transistor.

11. The memory cell as defined in claim 9, wherein a ratio of the p-type diffusion region over a total area of the memory cell first, is greater than a predefined ratio.

12. The memory cell as defined in claim 11, wherein the predefined ratio is in a range of 0.04 to 0.22.

13. The memory cell as defined in claim 9, wherein the read circuit comprises:
    two p-channel transistors, of which one of the p-channel transistors has a gate terminal coupled to one of two data storage nodes of the bistable element.

14. The memory cell as defined in claim 13, wherein the p-channel transistors comprises a threshold voltage of less than −0.4 volts.

15. A method of manufacturing a memory cell, comprising:
    forming a bistable element having at least first and second data storage nodes;
    forming a write port using only n-type metal oxide semiconductor (NMOS) transistors; and
    forming a read port using only p-type metal oxide semiconductor (PMOS) transistors, wherein a ratio of a region in which the PMOS transistors are formed to a total region of the memory cell is greater than a predefined ratio, and wherein the predefined ratio has a range that is between 0.04 and 0.22.

16. The method as described in claim 15, wherein forming the write port comprises:
    forming a first NMOS pass-gate transistor that is coupled to the first data storage node; and
    forming a second NMOS pass-gate transistor that is coupled to the second data storage node.

17. The method as described in claim 15, wherein forming the read port comprises:
    forming a first PMOS read port transistor that has a gate terminal that is coupled to the first data storage node; and
    forming a second PMOS read port transistor in series with the first PMOS read port transistor, wherein the second PMOS read port transistor has a gate terminal that is coupled to a read word line.

* * * * *